United States Patent
Qiu et al.

(10) Patent No.: US 9,591,738 B2
(45) Date of Patent: Mar. 7, 2017

(54) PLASMA GENERATOR SYSTEMS AND METHODS OF FORMING PLASMA

(75) Inventors: Huatan Qiu, Sunnyvale, CA (US); David Cheung, Foster City, CA (US); Prashanth Kothnur, San Jose, CA (US)

(73) Assignee: Novellus Systems, Inc., Fremont, CA (US)

( * ) Notice: Subject to any disclaimer, the term of this patent is extended or adjusted under 35 U.S.C. 154(b) by 1405 days.

(21) Appl. No.: 12/062,052

(22) Filed: Apr. 3, 2008

(65) Prior Publication Data

US 2009/0250334 A1    Oct. 8, 2009

(51) Int. Cl.
| | | |
|---|---|---|
| H01L 21/306 | (2006.01) | |
| C23C 16/00 | (2006.01) | |
| H05H 1/46 | (2006.01) | |
| H01J 37/32 | (2006.01) | |

(52) U.S. Cl.
CPC ............. *H05H 1/46* (2013.01); *H01J 37/321* (2013.01); *H01J 37/3211* (2013.01); *H01J 37/3244* (2013.01); *H01J 37/32119* (2013.01); *H01J 37/32174* (2013.01)

(58) Field of Classification Search
CPC ................ H01J 37/321; H01J 37/3211; H01J 37/32119; H01J 37/3244
USPC ...... 118/723 I, 723 IR, 723 AN; 156/345.48, 156/345.49; 315/111.51
See application file for complete search history.

(56) References Cited

U.S. PATENT DOCUMENTS

| | | | |
|---|---|---|---|
| 2,518,709 A | 8/1950 | Mosby, Jr. | |
| 2,874,001 A | 2/1959 | Webb | |
| 4,297,162 A | 10/1981 | Mundt et al. | |
| 4,337,415 A | 6/1982 | Durr | |
| 4,421,592 A * | 12/1983 | Shuskus et al. | ............ 117/103 |
| 4,718,976 A | 1/1988 | Fujimura | |
| 4,938,839 A | 7/1990 | Fujimura et al. | |
| 5,231,334 A | 7/1993 | Paranjpe | |
| 5,411,624 A | 5/1995 | Hirano et al. | |
| 5,436,528 A | 7/1995 | Paranjpe | |
| 5,439,524 A | 8/1995 | Cain et al. | |

(Continued)

FOREIGN PATENT DOCUMENTS

| | | |
|---|---|---|
| JP | 2001-23797 | 1/2001 |
| JP | 2003-059914 A1 | 2/2003 |

(Continued)

OTHER PUBLICATIONS

U.S. Appl. No. 12/052,401, Office Action mailed Mar. 29, 2011.

(Continued)

*Primary Examiner* — Luz Alejandro Mulero
(74) *Attorney, Agent, or Firm* — Weaver Austin Villeneuve & Sampson LLP (57) ABSTRACT

Systems and methods of forming plasma are provided. In an embodiment, a plasma generator system is provided including a container, a single coil disposed around the container, the single coil being a single member and having a first end, a second end, a first winding, and a second winding, wherein the first winding extends from the first end, and the second winding is integrally formed as part of the first winding and extends to the second end, an energy source electrically coupled directly to the first end of the single member, and a capacitor electrically coupled directly to the second end of the single member.

18 Claims, 7 Drawing Sheets

(56) References Cited

U.S. PATENT DOCUMENTS

| | | | |
|---|---|---|---|
| 5,503,881 A | 4/1996 | Cain et al. | |
| 5,556,501 A | 9/1996 | Collins et al. | |
| 5,614,055 A | 3/1997 | Fairbairn et al. | |
| 5,811,022 A | 9/1998 | Savas et al. | |
| 5,855,725 A * | 1/1999 | Sakai | 156/345.49 |
| 5,919,382 A | 7/1999 | Qian et al. | |
| 6,013,155 A | 1/2000 | McMillin et al. | |
| 6,054,013 A | 4/2000 | Collins et al. | |
| 6,086,679 A | 7/2000 | Lee et al. | |
| 6,164,241 A | 12/2000 | Chen et al. | |
| 6,180,019 B1 | 1/2001 | Kazumi et al. | |
| 6,203,657 B1 | 3/2001 | Collison et al. | |
| 6,229,264 B1 | 5/2001 | Ni et al. | |
| 6,247,425 B1 | 6/2001 | Lymberopoulos et al. | |
| 6,248,250 B1 | 6/2001 | Hanawa et al. | |
| 6,331,754 B1 | 12/2001 | Satoyoshi et al. | |
| 6,361,644 B1 * | 3/2002 | Collins | 156/345.1 |
| 6,379,576 B2 | 4/2002 | Luo et al. | |
| 6,444,084 B1 | 9/2002 | Collins | |
| 6,450,117 B1 * | 9/2002 | Murugesh et al. | 118/723 ME |
| 6,478,924 B1 | 11/2002 | Shamouilian et al. | |
| 6,495,963 B1 | 12/2002 | Bennett | |
| 6,551,447 B1 | 4/2003 | Savas et al. | |
| 6,565,661 B1 | 5/2003 | Nguyen | |
| 6,716,302 B2 | 4/2004 | Carducci et al. | |
| 6,797,639 B2 | 9/2004 | Carducci et al. | |
| 6,914,207 B2 * | 7/2005 | Kawaguchi et al. | 219/121.36 |
| 7,147,244 B2 | 12/2006 | Takahara | |
| 7,361,228 B2 | 4/2008 | Choi et al. | |
| 7,404,863 B2 | 7/2008 | Bergman | |
| 7,482,247 B1 | 1/2009 | Papasouliotis et al. | |
| 8,110,068 B2 | 2/2012 | Qiu et al. | |
| 8,864,935 B2 | 10/2014 | Fair et al. | |
| 8,916,022 B1 | 12/2014 | Caron | |
| 8,945,306 B2 | 2/2015 | Tsuda | |
| 9,209,000 B2 | 12/2015 | Qiu et al. | |
| 2001/0006093 A1 | 7/2001 | Tabuchi et al. | |
| 2001/0047760 A1 | 12/2001 | Moslehi | |
| 2002/0033233 A1 * | 3/2002 | Savas | 156/345.48 |
| 2002/0039625 A1 | 4/2002 | Powell et al. | |
| 2002/0088545 A1 * | 7/2002 | Lee et al. | 156/345.33 |
| 2003/0041971 A1 | 3/2003 | Kido et al. | |
| 2003/0070620 A1 | 4/2003 | Cooperberg et al. | |
| 2004/0045669 A1 | 3/2004 | Okumura et al. | |
| 2004/0221815 A1 * | 11/2004 | Fukuda et al. | 118/723.001 |
| 2005/0011447 A1 | 1/2005 | Fink | |
| 2005/0211168 A1 | 9/2005 | Yamada et al. | |
| 2006/0000802 A1 | 1/2006 | Kumar et al. | |
| 2006/0021574 A1 | 2/2006 | Armour et al. | |
| 2006/0070702 A1 | 4/2006 | Kido et al. | |
| 2006/0090852 A1 | 5/2006 | Kido et al. | |
| 2006/0090853 A1 | 5/2006 | Kido et al. | |
| 2006/0130756 A1 | 6/2006 | Liang et al. | |
| 2006/0130759 A1 | 6/2006 | Kido et al. | |
| 2006/0157199 A1 | 7/2006 | Kido et al. | |
| 2006/0157201 A1 | 7/2006 | Hoffman et al. | |
| 2007/0138134 A1 | 6/2007 | Hsieh et al. | |
| 2007/0170156 A1 * | 7/2007 | Hayashi | 219/121.45 |
| 2008/0121173 A1 | 5/2008 | Kido et al. | |
| 2008/0121179 A1 | 5/2008 | Park et al. | |
| 2008/0156264 A1 | 7/2008 | Fair et al. | |
| 2008/0156631 A1 * | 7/2008 | Fair et al. | 204/164 |
| 2009/0236313 A1 | 9/2009 | Qiu et al. | |
| 2010/0294860 A1 | 11/2010 | Hsieh | |
| 2010/0300359 A1 | 12/2010 | Armour et al. | |
| 2012/0097331 A1 | 4/2012 | Qui et al. | |
| 2012/0247674 A1 | 10/2012 | Fair et al. | |
| 2013/0025693 A1 | 1/2013 | Wang et al. | |
| 2015/0075718 A1 | 3/2015 | Fair et al. | |

FOREIGN PATENT DOCUMENTS

| | | |
|---|---|---|
| JP | 2003-243369 A1 | 8/2003 |
| JP | 2005-507159 A1 | 3/2005 |
| JP | 3691528 | 6/2005 |
| JP | 2005-045231 A1 | 4/2007 |
| KR | 1998-42744 A1 | 8/1998 |
| KR | 10-2006-0036846 | 5/2006 |
| KR | 2006-0086629 | 8/2006 |
| KR | 10-2007-0031785 | 3/2007 |
| KR | 2007-0041220 | 4/2007 |
| TW | 517096 | 1/2003 |
| TW | 589659 | 6/2004 |
| WO | 2008/143659 | 11/2008 |

OTHER PUBLICATIONS

U.S. Appl. No. 12/052,401, Notice of Allowance mailed Sep. 9, 2011.

U.S. Appl. No. 12/209,526, "Plasma generator systems and methods of forming plasma," Caron et al., filed Sep. 12, 2008.

U.S. Appl. No. 12/209,526, Office Action mailed Dec. 9, 2011.

U.S. Appl. No. 11/616,324, Office Action mailed Jul. 20, 2009.

U.S. Appl. No. 11/616,324, Office Action mailed Jan. 4, 2010.

U.S. Appl. No. 11/616,324, Office Action mailed Nov. 10, 2010.

U.S. Appl. No. 11/616,324, Office Action mailed Apr. 12, 2011.

U.S. Appl. No. 11/616,324, Office Action mailed Jun. 23, 2011.

U.S. Appl. No. 11/616,324, Notice of Allowance mailed Nov. 29, 2011.

U.S. Appl. No. 11/616,324, Allowed Claims, Nov. 29, 2011.

Savas, S. et al., "Using an ICP-based strip system to perform resist and barrier-layer removal in copper low-k processes," MICRO, October; Nov. 2004.

Luo, L. et al., "Characterization of a selectable-mode inductively coupled plasma (ICPsm) source for advanced dry residue removal applications," Mattson Technology, Inc., Abstract, 1998, ICPSM.

WO patent application No. PCT/US2007/064554, International Search Report and Written Opinion mailed Nov. 4, 2008.

U.S. Appl. No. 11/616,326, Office Action mailed Sep. 28, 2009.

U.S. Appl. No. 11/616,326, Office Action mailed Apr. 15, 2010.

U.S. Appl. No. 13/342,757, "Gas flow distribution receptacles, plasma generator systems, and methods for performing plasma stripping processes," Qiu et al., filed Jan. 3, 2012.

U.S. Appl. No. 12/209,526, Final Office Action mailed May 24, 2012.

U.S. Appl. No. 13/493,655, "Plasma Generator Apparatus," Fair et al., filed Jun. 11, 20012.

U.S. Appl. No. 11/616,324, Office Action, Apr. 30, 2012.

US Supplemental Notice of Allowability, dated Dec. 7, 2011, issued in U.S. Appl. No. 11/616,324.

US Final Office Action, dated Oct. 19, 2012, issued in U.S. Appl. No. 11/616,324.

US Office Action, dated Mar. 27, 2013, issued in U.S. Appl. No. 11/616,324.

US Final Office Action, dated Sep. 26, 2013, issued in U.S. Appl. No. 11/616,324.

US Office Action, dated Oct. 17, 2013, issued in U.S. Appl. No. 13/493,655.

US Final Office Action, dated Apr. 7, 2014, issued in U.S. Appl. No. 13/493,655.

US Notice of Allowance, dated Jun. 17, 2014, issued in U.S. Appl. No. 13/493,655.

JP patent publication No. 2001-23797, published Jan. 26, 2001, Satayoshi, English machine translation.

PCT International Preliminary Report on Patentability and Written Opinion dated May 27, 2014, issued in PCT/US2007/064554.

Korean Notice of Preliminary Rejection dated Mar. 11, 2013 issued in KR 10-2009-7012747.

Korean Second Notice of Preliminary Rejection dated Sep. 30, 2013 issued in KR 10-2009-7012747.

KR Notice of Preliminary Rejection dated Aug. 9, 2012 issued in Korean Application No. 20-2008-0014137.

U.S. Appl. No. 14/486,663, filed Sep. 15, 2014, entitled "Plasma Generator Apparatus".

US Notice of Allowance, dated Sep. 12, 2014, issued in U.S. Appl. No. 12/209,526.

Korean Office Action dated Jul. 28, 2014 issued in KR 10-2008-0087815.

(56) References Cited

OTHER PUBLICATIONS

US Office Action, dated Mar. 26, 2015, issued in U.S. Appl. No. 13/342,757.
US Notice of Allowance, dated Aug. 11, 2015, issued in U.S. Appl. No. 13/342,757.
US Notice of Allowance (Corrected Notice of Allowability), dated Aug. 26, 2015, issued in U.S. Appl. No. 13/342,757.
Korean Office Action dated Mar. 20, 2015 issued in KR 10-2008-0087815.
Korean Notice of Grounds for Rejection dated Mar. 18, 2016 issued in KR 10-2008-0087815.
Korean First Office Action dated May 2, 2016 issued in KR 10-2016-0007034.

* cited by examiner

PLASMA GENERATOR SYSTEMS AND METHODS OF FORMING PLASMA

TECHNICAL FIELD

The present invention generally relates to systems and methods of forming plasma and more particularly relates to plasma generator systems and methods of forming plasma using such plasma generator systems.

BACKGROUND

Plasma may be used in various processes for physically and/or chemically altering a surface of a workpiece. For example, plasma may be used to deposit or spray a layer of material onto a workpiece, to etch or sputter away unwanted material from a workpiece, or to perform ashing or stripping processes on a workpiece. Typically, plasma is generated using a plasma generator, which may include a tube, a coil, and a processing gas source. The tube may be made of a dielectric material, such as quartz or aluminum/sapphire, and may be at least partially surrounded by the coil. An inner surface of the tube defines a plasma chamber that is in flow communication with the processing gas source to receive a processing gas. To diffuse the processing gas before injection into the plasma chamber, a gas flow distribution receptacle may be disposed over an inlet thereof.

During operation, the coil is energized to create an electric field across the plasma chamber. As the processing gas flows through the electric field, a portion of the processing gas transforms into a plasma, which may include species such as electrons, ions, and reactive radicals. The plasma species flow to the workpiece, and depending on the particular process in which the plasma is used, may deposit onto the workpiece to form a layer or may react with materials on the workpiece to form removable species.

Although the aforementioned system yields high quality plasma, the system may be improved. For example, high voltages (e.g. greater than 5 kV) may be supplied to the coil to maintain plasma production; however, if the high voltages are applied beyond a threshold period of time, or above a threshold voltage, ions may form that bombard or sputter on the surfaces of the tube. As a result, the tube and/or surrounding components may have a shortened lifespan and maintenance thereof may be undesirably frequent. To at least partially alleviate this effect, a Faraday shield may be disposed between the tube and the coil; however, such a configuration may add complexity and costs to the system. In another example, in some configurations, plasma may flow from a plasma region in the tube having a small diameter (e.g., about 76 mm) to a distribution region in the tube having a larger diameter (e.g., about 300 mm), hence decreasing the density of plasma from region to region. As a result, the rate at which the ionized gas dissociates into reactive radicals may also vary, which may lead to a longer process duration than desired.

Accordingly, it is desirable to have an improved plasma generator system that may cause minimal ion bombardment and/or sputtering of its system components. Additionally, it is desirable for the plasma generator system to include components, such as gas flow distribution receptacles and tubes, with improved useful lives compared to components of conventional plasma generator systems to thereby decrease maintenance costs of such systems. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
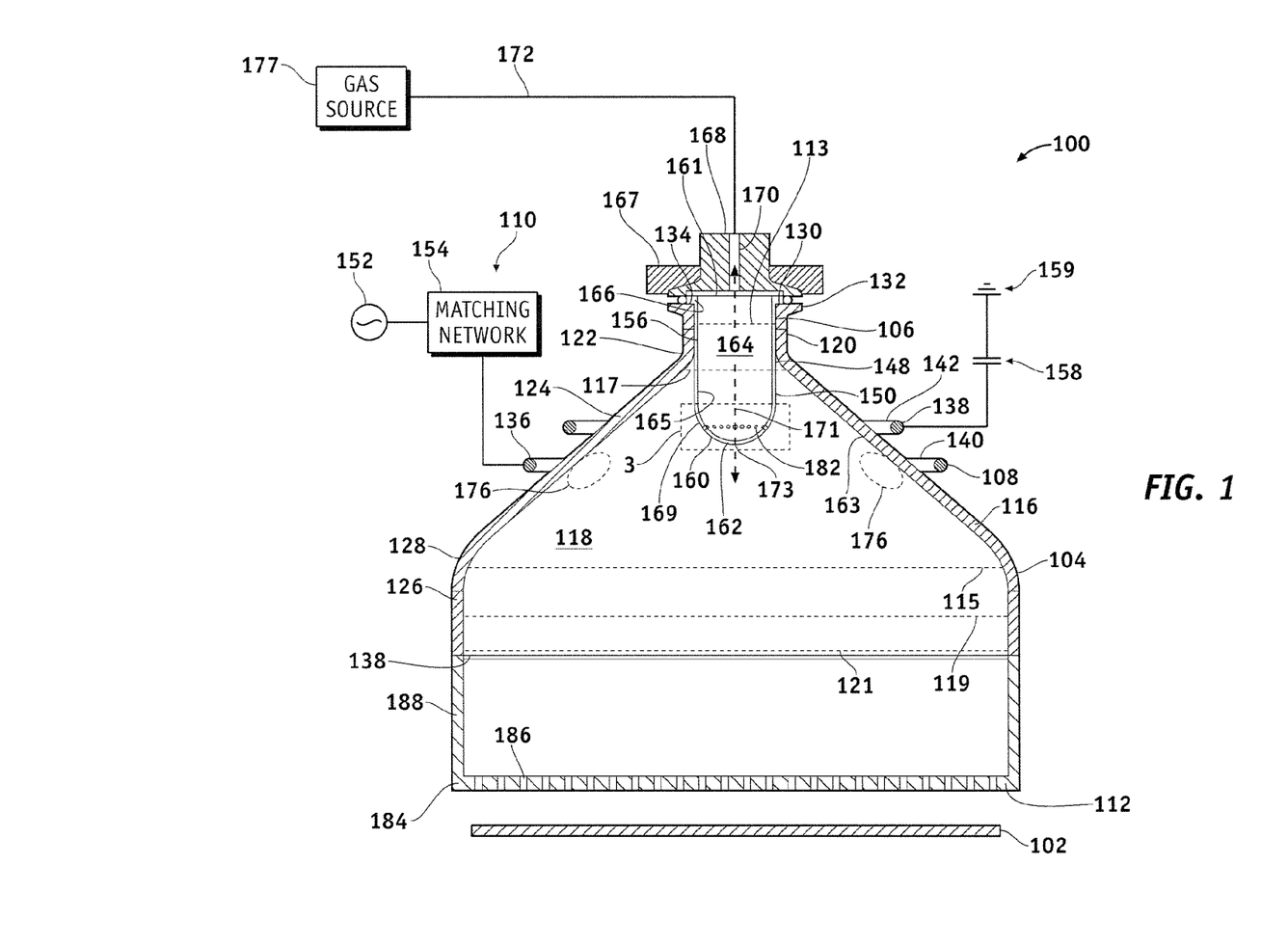
FIG. 1 is a simplified, cross-sectional view of a plasma generator system, according to an exemplary embodiment of the present invention.

FIG. 1 is a simplified, cross-sectional view of a plasma generator system 100, according to an exemplary embodiment of the present invention. The plasma generator system 100 is configured to generate plasma, which may be used to deposit or remove material from a workpiece 102. For example, the plasma generator system 100 may be used in conjunction with systems or components used for various plasma processing techniques, such as plasma enhanced chemical vapor deposition, plasma etching, plasma stripping or ashing, sputtering, plasma spraying, and the like. Accordingly, the workpiece 102 may be a substrate that may be subjected to one or more of the aforementioned processes. For instance, the workpiece 102 may be made of relatively pure silicon, germanium, gallium arsenide, or other semiconductor material typically used in the semiconductor industry, or of silicon admixed with one or more additional elements such as germanium, carbon, and the like, in an embodiment. In another embodiment, the workpiece 102 may be a semiconductor substrate having layers that have been deposited thereover during a conventional semiconductor fabrication process. In still another embodiment, the workpiece 102 may be a component, such as a sheet of glass, ceramic or metal that may be subjected to plasma processing.

The plasma generator system 100 may be a remote, stand alone apparatus or an in-situ module that is incorporated into a processing system. The plasma generator system 100 shown in FIG. 1 is an example of a remote apparatus. In accordance with an exemplary embodiment of the present invention, the plasma generator system 100 includes a container 104, a coil 108, an energy source 110, a gas flow distribution receptacle 106, and a showerhead 112. Although an in-situ module may not be configured identically to the embodiment shown in FIG. 1, it may include similar components.

The container 104 is configured to receive a processing gas that can be ionized by an electric field and transformed into a plasma, including species such as electrons, ions, and reactive radicals for depositing material onto or removing material from the workpiece 102. In an exemplary embodiment, the container 104 is made of a material that is capable of enhancing the electric field. For example, the container 104 may be made of a dielectric material including, but not limited to quartz, aluminum/sapphire, and ceramic. To contain the plasma therein, the container 104 has a sidewall 116 that defines a plasma chamber 118. The sidewall 116 has any thickness that is suitable for containing plasma within the container 104 and that does not interfere with the electric field produced by the coil 108. In an exemplary embodiment, the sidewall 116 has a thickness in a range of from about 4 mm to about 6 mm. In another exemplary embodiment, the sidewall 116 has a substantially uniform thickness (e.g., ±0.5 mm) along its entire axial length. In still another embodiment, the sidewall 116 has a varying thickness along its axial length.

The sidewall 116, and hence, the plasma chamber 118, are shaped to allow the plasma to be directed toward the workpiece 102. In one exemplary embodiment, the sidewall 116 has a shape that varies along its axial length, as depicted in FIG. 1. For example, the sidewall 116 may include a neck section 120 extending from an inlet end 122 of a plasma-containing section 124 and a tube section 126 extending from an outlet end 128 of the plasma-containing section 124. The neck section 120 may be cylindrical and may have an inlet 130 and a lip 132 that protrudes radially outwardly from an end 134 of the neck section 120 proximate the inlet 130. In one exemplary embodiment, the neck section 120 has a substantially uniform diameter (shown as dotted line 113) (e.g., ±0.5 mm) along its axial length. In another exemplary embodiment, the neck section 120 has a varying diameter. In yet another exemplary embodiment, the diameter 113 is in a range of from about 30 mm to about 60 mm. In other embodiments, the container 104 may not include a neck section 120.

In any case, the plasma-containing section 124 includes an inlet 148 to the plasma chamber 118. According to a preferred embodiment, the plasma-containing section 124 may be cone-shaped and may have an outlet end diameter (shown as dotted line 115) that is greater than an inlet end diameter (shown as dotted line 117). In one exemplary embodiment, the outlet end diameter 115 is also greater than the diameter 113 of the neck section 120. In another exemplary embodiment, the outlet end diameter 115 is in a range of from about 150 mm to about 350 mm, while the diameter 113 of the neck section 120 is in the range of from about 30 mm to about 60 mm. In other embodiments, the diameters 115, 113 may be larger or smaller than the aforementioned ranges.

In accordance with another exemplary embodiment of the present invention, the tube section 126 has a substantially uniform diameter (shown as dotted line 119) that is substantially equal (e.g., ±0.5 mm) to the outlet end diameter 115 of the plasma-containing section 124. In another exemplary embodiment, the diameter 119 of the tube section 126 is greater than the outlet end diameter 115 of the plasma-containing section 124. In yet another exemplary embodiment, the diameter 119 of the tube section 126 is in a range of from about 150 mm to about 350 mm, and the outlet end diameter 115 of the plasma-containing section 124 may be in a range of from about 75 mm to about 300 mm. In other embodiments, the diameters 119, 115 may be larger or smaller than the aforementioned ranges.

The tube section 126 includes an outlet 138 from the plasma chamber 118 that may be at least as large as a diameter of the workpiece 102. In an exemplary embodiment, the outlet 138 has a diameter (depicted as dotted line 121) that is in the range of from about 150 mm to about 350 mm. In another exemplary embodiment, the outlet 138 has a diameter 121 that is smaller than or larger than the aforementioned ranges. For example, in embodiments in which only a desired portion of the workpiece 102 is to be subjected to a plasma process, the diameter 121 of the outlet 138 corresponds to the size of the desired portion.

According to an exemplary embodiment of the present invention, the neck section 120, the plasma-containing section 124, and the tube section 126 have axial lengths that are substantially unequal to each other. In an exemplary embodiment, the neck section 120 has an axial length that is sufficient to stabilize the gas flow distribution receptacle 104 in the container 106, but not so long as to impede gas flow into the plasma chamber 118 as further discussed below. In such case, the axial length of the neck section 120 is less than that of the plasma-containing section 124 and is less than that of the tube section 126. In one exemplary embodiment, the axial length of the neck section 120 may be one-third the axial length of the plasma-containing section 124 or less. In another exemplary embodiment, the neck section 120 and the tube section 126 have axial lengths that are substantially equal to each other, but are less than the axial length of the plasma-containing section 124. In any case, the plasma-containing section 124 preferably has an axial length that is greater than an axial length of the tube section 126, regardless of the axial length of the neck section 120, because, as will be discussed in more detail below, such a configuration when used in conjunction with the coil 108 may contribute to a production of a higher concentration of plasma having a more uniform density in a desired portion of the plasma chamber 118. In a particular example, the axial length of the plasma-containing section 124 is more than two (2) times longer than that of the tube section 126. In one exemplary embodiment, the axial length of the plasma-containing section 124 is in a range of from about 100 mm to about 300 mm, and the axial length of the tube section 126 is in a range of from about 30 mm to about 150 mm. In other embodiments, the axial lengths of the plasma-containing section 124 and the tube section 126 may be longer or shorter, depending on the particular dimensions of the surrounding components.

To provide an electric field across the plasma chamber 118, the coil 108 surrounds at least a portion of the container 104. In an exemplary embodiment, the coil 108 is a single member made of a conductive material, such as copper. In accordance with another exemplary embodiment, the coil 108 has a first end 136 and a second end 138 between which at least two windings 140, 142 are formed about the container 104. The first end 136 is electrically coupled to the energy source 110. The first winding 140 extends from the first end 136 and makes one complete rotation about the container 104. The second winding 142 is integral with the first winding 140 and encircles the container 104 once, terminating at the second end 138, which is electronically coupled to a capacitor 158 and an electrical ground 159.

In an exemplary embodiment, such as shown in FIG. 1, the first winding 140 is located below the second winding 142. In such case, because the first winding 140 is disposed around a portion of the plasma-containing section 124 that has a larger diameter than another portion thereof, the first winding 140 correspondingly has a larger diameter than the second winding 142. The first winding 140 may have a diameter in a range of between about 10 cm and about 40 cm, and the second winding 142 may have a diameter in a range of between about 10 cm and about 35 cm. However, it will be appreciated, that the dimensions of the windings 140, 142 may be larger or smaller than the aforementioned ranges depending on the dimensions of the outer diameter of the container 104.

The particular positioning of the first winding 140 relative to the second winding 142 may be dependent on a desired position of a toroidally-shaped zone or "plasma zone" 176 in the container 104 at which a maximum plasma density will exist. Specifically, the plasma zone 176 typically forms in a portion of the plasma chamber 118 that is closest to the first winding 140, because the first winding 140 dissipates more energy from energy source 110 into the processing gas than any other portion of the coil 108. As a result, the current received by the first winding 140 produces a voltage that is higher than that of any other portion of the coil 108 section. Thus, if a desired location of the plasma zone 176 is to be located a particular axial distance from the workpiece 102, then the first winding 140 is disposed accordingly at a position along the axial length of the container 104. According to an exemplary embodiment, at least two windings 140, 142 are included. In particular, the first winding 140 ensures at least one closed loop is formed to thereby produce a more stable plasma in the plasma chamber 118, and the inclusion of the second winding 142 enhances uniformity of the plasma in the plasma chamber 118. Though more windings may be included in other embodiments, they are not necessary, as the inclusion of the additional windings does not adversely affect nor substantially improve the production or quality of plasma in the plasma zone 176.

Figure 2:
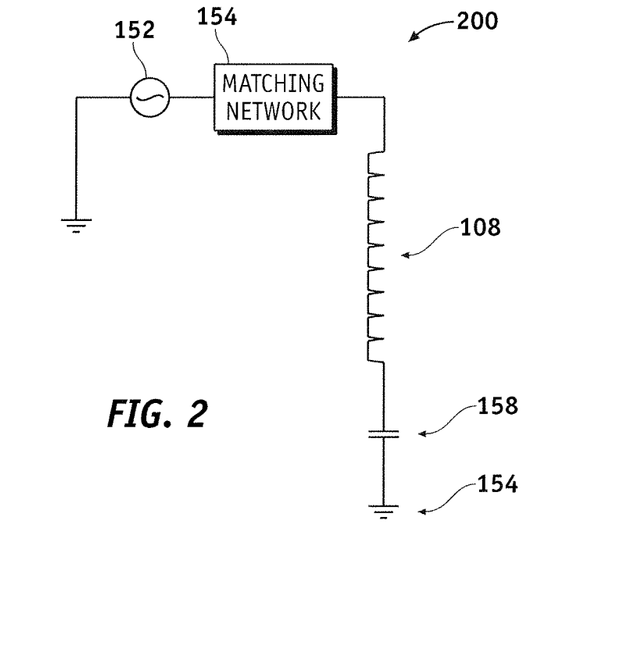
FIG. 2 is a simplified schematic of a circuit that may be implemented into a plasma generator system, according to an exemplary embodiment of the present invention.

To form the plasma zone 176, the energy source 110 is electrically coupled directly to the first end 136 of the coil 108 to form a circuit. FIG. 2 is a simplified schematic of a circuit 200 comprising the coil 108, in accordance with an exemplary embodiment of the present invention, and may be referred to in conjunction with FIG. 1, as like components are represented by like reference numerals. The energy source 110 may be a radio frequency (RF) voltage source or other source of energy capable of energizing the coil 108 to form an electric field. In an exemplary embodiment, the energy source 110 includes an RF generator 152 that is selected for an ability to operate at a desired frequency and to supply a signal to the coil 108. For example, the RF generator 152 may be selected to operate within a frequency range of about 0.2 MHz to about 20.0 MHz. In one exemplary embodiment, the RF generator 152 may operate at 13.56 MHz. In an exemplary embodiment, the energy source 110 may include a matching network 154 disposed between the RF generator 152 and the coil 108. The matching network 154 may be an impedance matching network that is configured to match an impedance of the RF generator 152 to an impedance of the coil 108. In this regard, the matching network 154 may be made up of a combination of components, such as a phase angle detector and a control motor; however, in other embodiments, it will be appreciated that other components may be included as well.

In another exemplary embodiment of the circuit 200, the capacitor 158 is included to limit voltage flow through the coil 108. In this regard, the capacitor 158 is selected to have a capacitance that limits a peak-to-peak voltage flow through the coil 108 to a threshold voltage. According to an exemplary embodiment of the present invention, the threshold voltage may depend on an impedance value of the coil 108 and the RF generator 152. In an example, the capacitor 158 may be selected for an ability to reduce voltage flow through the coil 108 to about 50% of an initial voltage input. According to another exemplary embodiment of the present invention, the capacitor 158 is also selected for an ability to enhance the impedance-matching capabilities of the matching network 154 to match the impedance of RF generator 152 to that of the coil 108. In any case, the capacitor 158 is electrically coupled to the second end 138 of the coil 108 between the coil 108 and the electrical ground 159. By positioning a single capacitor 158 downstream of the coil 108 and closer to the electrical ground 159, as opposed to including one or more capacitors between the energy source 110 and the coil 108 and/or between the windings 140, 142, a lower voltage may be used to form plasma in the plasma zone 176. As a result, a voltage drop experienced along the coil 108 and between the windings 140, 142 may be lower than in other circuit configurations, which reduces both ion bombardment and sputtering on surfaces of the container 104 and arcing between the windings 140, 142 and surrounding components.

To maximize system operability, the coil 108 is disposed at an optimum location around the container 104 that minimizes a volume within the plasma chamber 118 occupied by the plasma zone 176 and maximizes the density of plasma in the plasma zone 176. Various factors contribute to the determination of the optimum location, including, but not limited to the maximum peak-to-peak voltage flow to be allowed by the capacitor 158. In such case, the maximum voltage may determine an allowable impedance of coil 108 and capacitor 158, and an allowable impedance of RF generator 152. These factors, in turn, may be employed to determine a total length of the coil 108. Thus, depending on desired system parameters, the total length of the coil 108 may be relatively long (e.g., have a length greater than 5 m) or may be relatively short (have a length less than 1 m), with a suitable corresponding number of windings 140, 142 about the container 104. Additionally, each winding 140, 142 is disposed a suitable, substantially uniform distance away from the surface of the container 104 so that the plasma zone 176 forms within the plasma chamber 118 adjacent to an inner surface 163 of the container 104. In this way, the container inner surface 163 may guide the reactive radicals toward the chamber outlet 138 during processing. For example, in an exemplary embodiment, the coil 108 may be in a range of 10 mm and 30 mm away from the container.

As mentioned above, in order to enhance stability and uniformity of the plasma, at least two windings are included no matter the total length of the coil 108. Accordingly, each winding may have a particular maximum diameter, which may limit the actual locations around the container 104 at which the coil 108 and windings may be located. Additionally, an actual position of the coil 108 may be dependent on the shape of the container 104 (e.g., whether the container 104 has a substantially uniform diameter or a varying diameter along its axial length). For example, in one exemplary embodiment, the container 104 may have a varying diameter along its axial length, such as shown in FIG. 1;

thus, the coil 108 may be disposed at a location along the axial length of the container 104 at which the container 104 has a smallest diameter. In one exemplary embodiment, the plasma-containing section 124 may have the smallest diameter of the container 104, and the coil 108 may surround at least a portion of the plasma-containing section 124. In another exemplary embodiment of the present invention in which the plasma-containing section 124 has a cone shape, the coil 108 may be positioned between the inlet and outlet ends 122, 128 of the plasma-containing section 124, as illustrated in FIG. 1.

The processing gas may be diffused before injection into the plasma chamber 118 to substantially uniformly distribute the gas to the plasma zone 176. In this regard, in one exemplary embodiment, the gas flow distribution receptacle 106 is disposed in the plasma chamber inlet 148 and has any one of numerous shapes, depending on the location of the plasma zone 176 in the container 104. According to one exemplary embodiment, the gas flow distribution receptacle 106 includes a cup member 150 and is made of a material that is non-conductive and is capable of withstanding corrosion when exposed to the processing gas. Suitable materials include, for example, dielectric materials such as quartz.

The cup member 150 may include a cylindrical section 156 and a rounded section 160. The cylindrical section 156 may define a portion of a reception cavity 164 having an open end 161. Additionally, the cylindrical section 156 may have an outer diameter that is less than the inner diameter of the plasma chamber inlet 148. In an exemplary embodiment, a flange 166 extends radially outwardly from the cylindrical section 156. The flange 166 may be used to retain the gas flow distribution receptacle 106 in position on the container 104 and may be clamped between a seal 168 and the container 104. In this regard, the outer diameter of the flange 166 is larger than an inside diameter of the neck section inlet 130. In an exemplary embodiment, the outer diameter of the flange 166 is substantially equal (e.g., ±0.5 mm) to the outer diameter of the container lip 132. In other examples, the outer diameter of the flange 166 may be larger or smaller. In another exemplary embodiment, the seal 168 has a diameter that is substantially equal to (e.g., ±0.5 mm) or larger than an outer diameter of the flange 166. For example, the flange 166 may have an outer diameter that is in the range of from about 40 mm to about 70 mm, and the seal 168 may have a diameter that is larger. In other embodiments, the diameters may be smaller or larger. A clamping fixture 167 may surround at least the flange 166, the seal 168, and the container lip 132 to ensure that the gas flow distribution receptacle 106 remains disposed at a desired location on the container 104. To allow access into the reception cavity 164, the seal 168 may include one or more openings 170. The openings 170 may be configured to receive one or more corresponding gas connection lines 172 to provide flow communication with a processing gas source 177.

The rounded section 160 is generally hemispherically-shaped and has a longitudinal axis 171 that extends therethrough and through the reception cavity 164. Gas injection openings 182 are included within the rounded section 160 and are adapted to provide flow communication between the reception cavity 164 and the plasma chamber 118. To control the manner in which the processing gas is injected into the plasma chamber 118, the gas injection openings 182 may be formed and positioned so that the processing gas flows along predetermined gas injection paths. The gas injection paths generally allow the gas to flow axially from a first location in the reception cavity 164 through openings 182 to a second location substantially (e.g., ±0.5 mm) adjacent to or over the plasma zone 176. Although the plasma zone 176 is toroidally-shaped due to the placement of the coils 108 around the plasma-containing section 124 of the container 104, the plasma zone 176 may having a peak density at a center; thus, the plasma zone 176 may be disk-shaped in other embodiments. In an exemplary embodiment, the first location is a point in the reception cavity 164 that optimizes a pressure difference between the reception cavity 164 and the plasma chamber 118 to thereby maximize a velocity of the processing gas, while minimizing a distance to the plasma zone 176. For example, the first location may be a point in the reception cavity 164 that is substantially equidistant (e.g., ±0.5 mm) from each point on a circumference of an inner surface of the rounded section 160. It will be appreciated that the location of the openings 182 on the cup member 150 also may depend on a particular location of the plasma zone 176 within chamber 118.

The number of openings 182, the size of the openings 182, and the direction in which the openings 182 are formed relative to an outer surface 169 of the receptacle 106 may be further selected to control the manner in which the gas is injected. For example, to substantially evenly distribute the processing gas within the plasma chamber 118, thirty to forty openings 182 may be included. In one particular example, twenty-four openings 182 may be included. In other embodiments, more or fewer openings 182 may be included. In one exemplary embodiment, the openings 182 are disposed symmetrically about the longitudinal axis 171 and are substantially evenly spaced around a circumference of the rounded section 160 to form a ring. In another exemplary embodiment, the openings 182 are not evenly spaced around a circumference of the rounded section 160. For example, sets of two or more openings may be formed close together, and each set may be equally spaced from the longitudinal axis 171. In any case, the openings 182 are spaced such that the processing gas may be substantially evenly injected into the plasma chamber 118.

In one exemplary embodiment of the present invention, each opening 182 has a diameter that is substantially identical (e.g., ±0.5 mm) to a diameter of an adjacent opening 182. In another exemplary embodiment, the openings 182 have diameters that vary within a range. For example, each opening 182 may have a diameter that is within a range of from about 0.5 mm to about 3.0 mm. In other examples, the openings 182 may be larger or smaller than the aforementioned diameter range.

Figure 3:
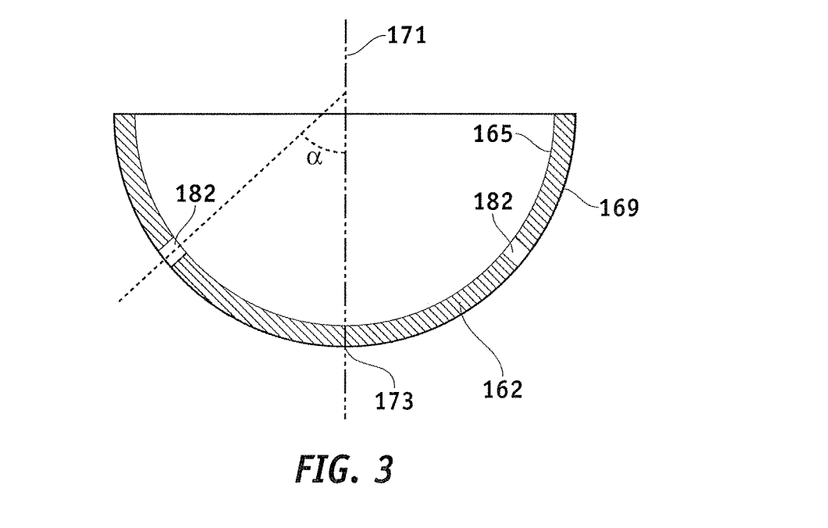
FIG. 3 is a close up cross section view of a rounded section of the gas flow distribution receptacle of FIG. 1, according to an exemplary embodiment of the present invention.

Turning to FIG. 3, a close-up cross-sectional view of the rounded section of the gas flow distribution receptacle 106 is provided. Each opening 182 extends through the receptacle 106 at a gas injection angle ($\alpha$) relative to the longitudinal axis 171. In an exemplary embodiment, to more evenly disperse the processing gas into the plasma chamber 118, the gas injection angle ($\alpha$) is greater than 0° relative to the longitudinal axis 171 and, preferably, is in a range of from about 45° to about 90°. For example, the gas injection angle ($\alpha$) may be about 60°. In other embodiments, the gas injection angle may be less than or greater than the aforementioned range.

Referring back to FIG. 1, when the energy source 110 energizes the coil 108, an electric field is formed in a selected portion of the plasma chamber 118 to thereby ionize the processing gas that may flow therethrough to form ionized gas. As used herein, the term "ionized gas" may include, but is not limited to, ions, electrons, neutral species, excited species, reactive radicals, dissociated radicals, and any other species that may be produced when the processing gas flows through the electric field. To control dispersion of the ionized gas across the work piece 102, the showerhead 112 may be positioned at the plasma chamber outlet 138. In one exemplary embodiment, the showerhead 112 includes a plate 184. The plate 184 may be made from any suitable material that is relatively inert with respect to the plasma, such as aluminum or ceramic. Generally, the plate 184 is sized to allow gas dispersion over an entirety of the workpiece 102 and thus, has a correspondingly suitable diameter.

To allow gas passage therethrough, the plate 184 is relatively porous. In particular, the plate 184 includes through-holes 186 that are suitably sized and spaced to disperse the ionized gas over the work piece 102 in a substantially uniform manner. In one exemplary embodiment, the through-holes 186 have a diameter in a range of from about 2 mm to about 10 mm. In another exemplary embodiment, the through-holes 186 are present at a surface density in a range of from about 0.005 holes/mm$^2$ to about 0.2 holes/mm$^2$. In other embodiments, the through-holes 186 have larger or smaller dimensions than the ranges previously provided. In another exemplary embodiment, the through-holes 186 are substantially uniformly sized (e.g., ±0.5 mm). Additionally, the through-holes 186 are disposed in a substantially uniform pattern on the showerhead 112, in one exemplary embodiment but, in another exemplary embodiment, the through-holes 186 are disposed in a non-uniform pattern.

In an exemplary embodiment of the present invention, the showerhead 112 is directly coupled to the container 104, as shown in FIG. 1. For example, the showerhead 112 may include sidewalls 188 that extend axially from the plate 184 and that are coupled to the container 104 via bolts, clamps, adhesives or other fastening mechanisms. In another embodiment, the showerhead 112 may be integral with the container 104. The sidewalls 188 may be used to provide additional distance between the plasma zone 176 and the workpiece 102, and thus, may be configured accordingly.

Figure 4:
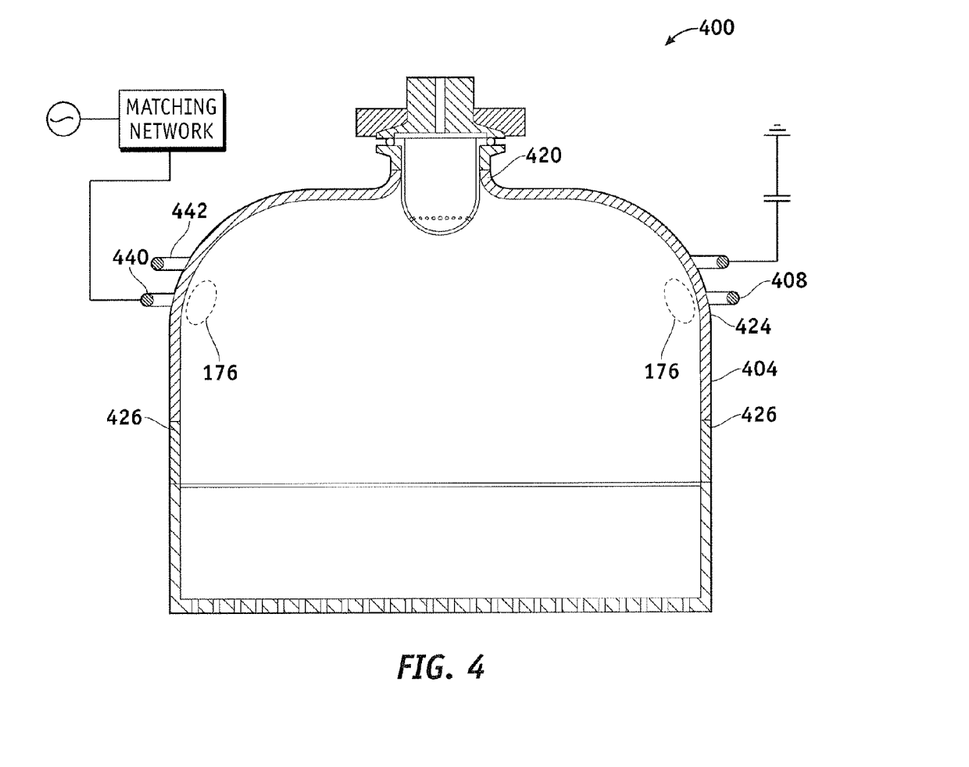
FIG. 4 is a simplified, cross-sectional view of a plasma generator system, according to an exemplary embodiment of the present invention.

It will be appreciated that, although FIG. 1 illustrates an embodiment of the plasma generator system 100 including certain components, additional components or components shaped differently than those shown in FIG. 1 may alternatively be employed. For example, in according with another exemplary embodiment of the present invention, FIG. 4 illustrates a plasma generator system 400 that includes substantially identical components as system 100, except that a plasma-containing section 424 of a container 404 of the system 400 is dome-shaped. In this embodiment, the axial length of the dome-shaped plasma-containing section 424 is greater than the axial length of a tube section 426 of the container 404. Although a neck section 420 is shown as extending from the plasma-containing section 424, other embodiments may not include the neck section 420. Additionally, although a first winding 440 and a second winding 442 of a coil 408 are shown as being disposed around the plasma-containing section 424, the windings 440, 442 of the coil 408 alternatively may be disposed between the tube section 426 and the plasma-containing section 424, in another exemplary embodiment.

Figure 5:
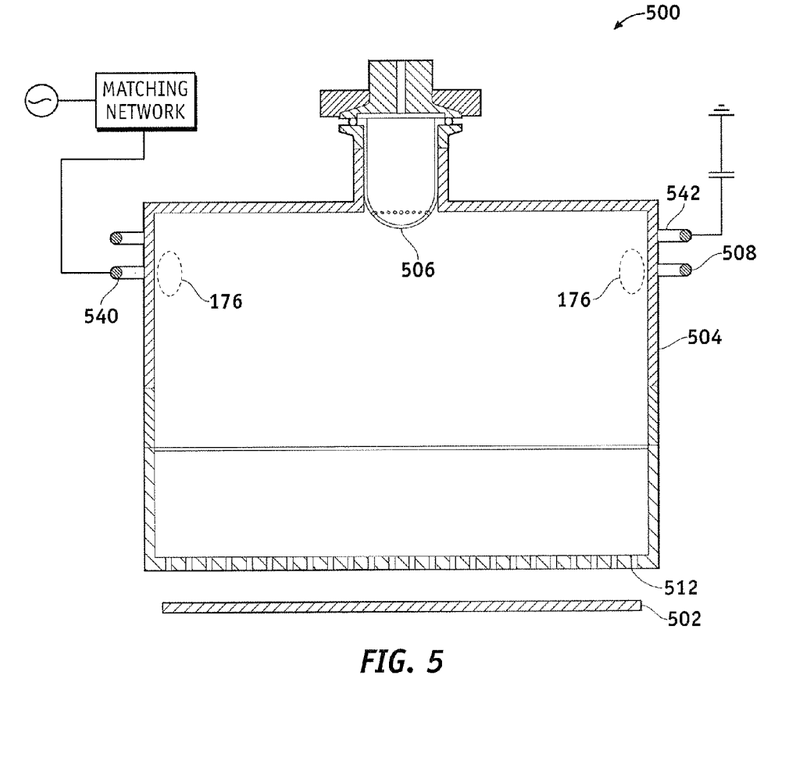
FIG. 5 is a simplified, cross-sectional view of a plasma generator system, according to an exemplary embodiment of the present invention.

FIG. 5 is a cross-sectional view of a plasma generator system 500 according to yet another exemplary embodiment of the present invention. Here, the plasma generator system 500 includes substantially similar components as those of systems 100 and 400, except that a container 504 of the system 500 has a substantially uniform diameter along its entire axial length. Accordingly, a coil 508 surrounds a portion of the container 504 and includes a first winding 540 and a second winding 542 having substantially equal diameters to each other. Additionally, as shown in FIG. 5, dimensions and placement of a showerhead 512, workpiece 502, and a gas flow distribution receptacle 506 relative to the coil 508 may differ from systems 100, 400 due to the shape of the container 504.

Figure 6:
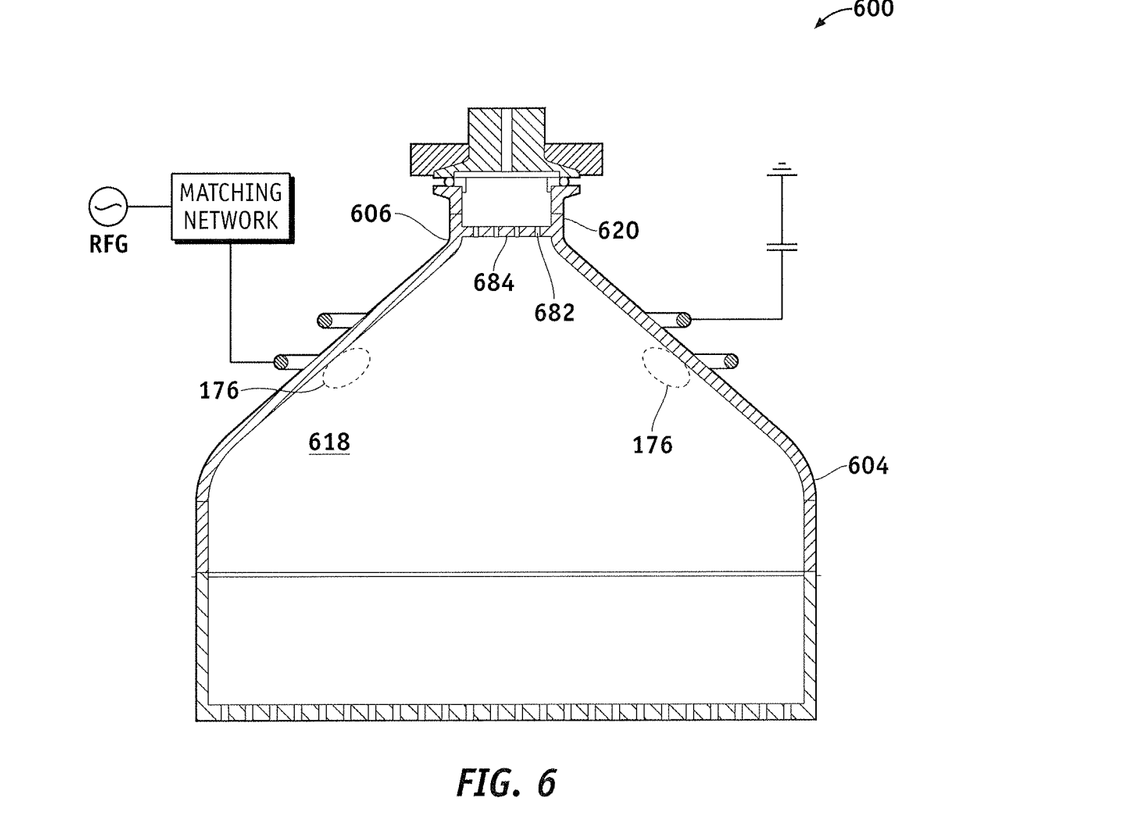
FIG. 6 is a simplified, cross-sectional view of a plasma generator system, according to an exemplary embodiment of the present invention.

FIG. 6 is a cross-sectional view of a plasma generator system 600 according to another exemplary embodiment of the present invention. The system 600 is similar to system 100 described above, but includes a gas flow distribution receptacle 606 that is formed as part of a neck section 620 of a container 604. In particular, a plate 684 is disposed upstream of an inlet to a plasma chamber 618. The plate 684 includes openings 682 through which processing gas flows during operation, and the openings 682 are formed substantially similarly to those included in gas distribution receptacle 106 in FIG. 1.

Figure 7:
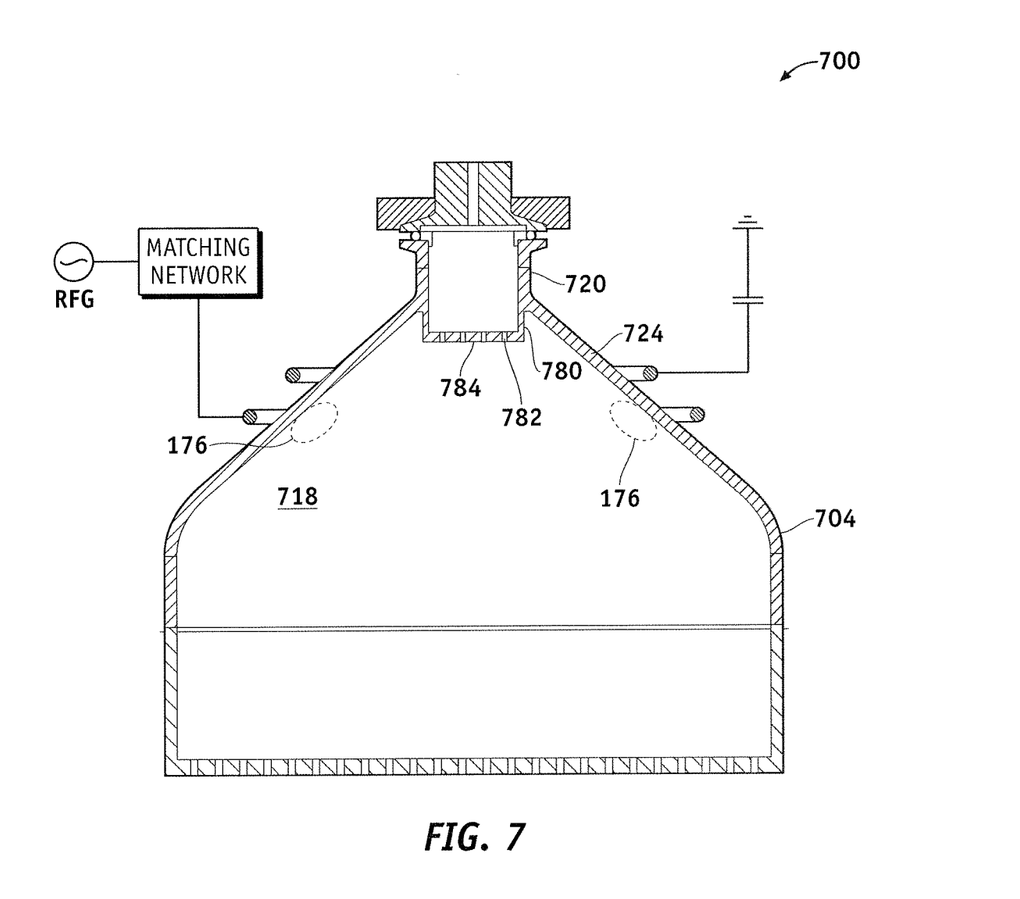
FIG. 7 is a simplified, cross-sectional view of a plasma generator system, according to an exemplary embodiment of the present invention.
Figure 8:
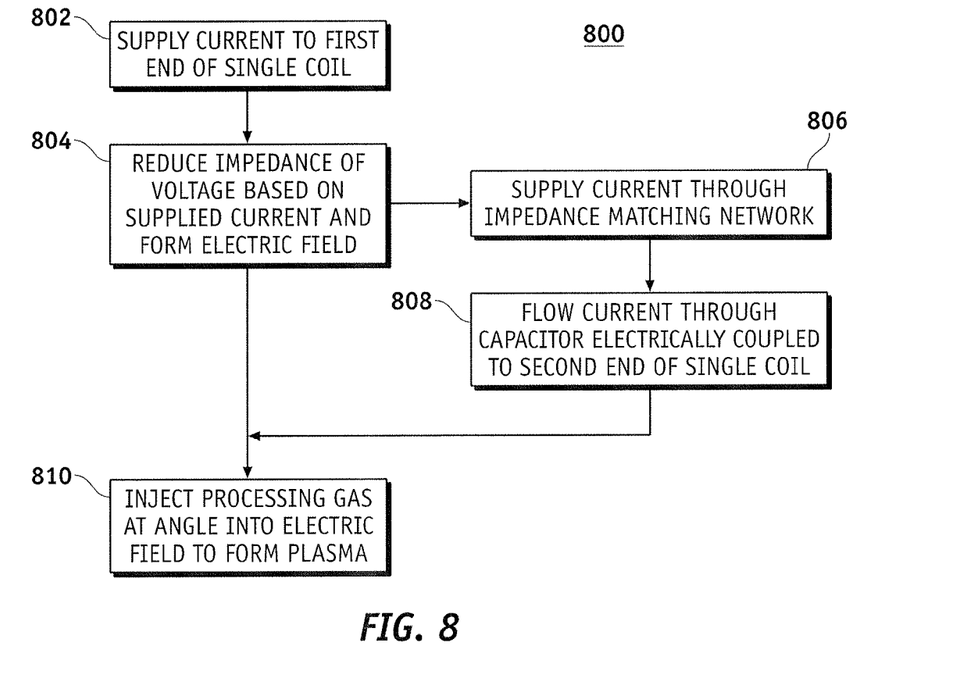
FIG. 8 is a flow diagram of a method of forming plasma, according to an exemplary embodiment of the present invention.

In still another exemplary embodiment of the present invention, FIG. 7 is a cross-sectional view of a plasma generator system 700 that is similar to system 600 described above, except that a plate 784 is disposed within a plasma-containing section 724 of a container 704. According to an exemplary embodiment, a cylindrical sidewall 780 extends from a neck section 720 of the container into a plasma chamber 718 defined by the plasma-containing section 724, and the plate 784 encloses an end of the neck section 720. Openings 782 are formed in the plate 784 substantially similarly to those included in system 600. No matter the particular physical embodiment of the system 100, each embodiment forms plasma according to a similar method. FIG. 8 is a flow diagram of a method 800 of forming plasma, according to an exemplary embodiment, that may be used with systems 100, 400, 500, 600, and 700. In an exemplary embodiment, current from a current generator is supplied to a first end of a single coil surrounding a container to energize a first winding extending from the first end and a second winding extending to a second end of the single coil, step 802. Next, an impedance of a voltage based on the supplied current is reduced and an electric field is formed, step 804. According to an exemplary embodiment, reduction is achieved by flowing the current through an impedance matching network that matches an impedance value of the generator with an impedance value of the single coil, step 806. In accordance with another exemplary embodiment, reduction may be further achieved by flowing the current through a capacitor that is electrically coupled to the second end of the single coil downstream of the second winding and upstream of a ground, step 808.

A processing gas may flow through the electric field to form a plasma, step 810. According to an exemplary embodiment, the processing gas may be injected into the container through a gas distribution receptacle located at an inlet of the container. The receptacle may be integrally formed as part of the container, or separately from the container. In one example, the gas distribution receptacle may have a plurality of openings formed therein at an angle relative to a longitudinal axis extending therethrough to allow a majority of the processing gas to flow through the electric field. For example, in an embodiment, the processing gas may be injected through the openings that are at an angle in a range of between 45° and 90° relative to the longitudinal axis. In another example, the processing gas may be injected through the openings at an angle of 60° relative to the longitudinal axis. Additionally, each opening may have a diameter that is substantially identical (e.g., ±0.5 mm) to a diameter of an adjacent opening.

The particular gas selected for the processing gas may depend on the particular process in which the plasma may be used. In an exemplary embodiment, the processing gas includes a fluorine-comprising gas. Examples of fluorine-comprising gases suitable for use include nitrogen trifluoride ($NF_3$), sulfur hexafluoride ($SF_6$), hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), octofluoro[1-]butane ($C_4F_8$), octofluoro[2-]butane ($C_4F_8$), octofluoroisobutylene ($C_4F_8$), fluorine ($F_2$), and the like. In another embodiment, the processing gas may additionally comprise an oxygen-comprising gas. For example, the oxygen-comprising gas may include, but is not limited to, oxygen ($O_2$) and $N_2O$. In other embodiments, the processing gas may additionally comprise an inert gas, such as, for example, nitrogen ($N_2$), helium, argon, and the like. In one exemplary embodiment, the processing gas may be used in a plasma stripping process and may be a mixture of gases, such as $O_2/N_2/CF_4$ at a ratio of 20:8:1 by flow percent. In other embodiments, the mixture may include different ratios of the aforementioned gases. In still other embodiments, different gases and different ratios may be used.

After the plasma is formed, it may be used in various processes in which plasma may be employed to alter a surface of a workpiece. For example, in an exemplary embodiment, the plasma may be used in a plasma stripping or ashing process. In such case, a continuous supply of processing gas is fed into the container and allowed to circulate therein and through the electric field. A portion of the gas dissociates into reactive radicals. In accordance with an exemplary embodiment of the present invention, the reactive radicals are flowed to a workpiece disposed at an outlet of the container. For example, in an embodiment in which the processing gas includes a fluorine-comprising gas, a portion of the fluorine-comprising gas ionizes to form a plasma including electrons, fluorine ions and reactive fluorine radicals. In an exemplary embodiment of the present invention, some of the reactive fluorine radicals may flow through the plasma chamber, through a showerhead, and may deposit on the workpiece, while another portion of the reactive fluorine radicals may recirculate within the plasma chamber before depositing onto the workpiece. The ionized gas is then deposited onto the workpiece. For example, the ionized gas, including reactive radicals, flows from the plasma chamber, through the showerhead, onto the workpiece.

A system has now been provided that has reduced ion bombardment and/or sputtering of system components, as compared with conventional plasma generator systems. Because of the reduction in ion bombardment and sputtering, the improved plasma generator system now includes components, such as gas flow distribution receptacles and tubes, having improved useful lives compared to components of conventional plasma generator systems. As a result, maintenance costs of the systems are reduced as well.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A remote plasma generator system comprising:
a container comprising a container inlet and a container outlet;
a gas flow distribution receptacle disposed at the container inlet, the gas flow distribution receptacle comprising a hemispherical tip having a plurality of openings symmetrically distributed around the hemispherical tip;
a showerhead positioned at the container outlet; and
a continuous coil disposed around the container, the continuous coil having a first end configured to couple to an energy source, a second end configured to couple to an electrical ground connection and a capacitor, a first winding, and a second winding, wherein the first winding extends from the first end and the second winding is integral with the first winding and extends to the second end, wherein each opening of the hemispherical tip is oriented at an acute angle relative to a longitudinal axis that extends through the hemispherical tip, the openings being oriented at identical acute angles that direct gas flow towards the first winding of the continuous coil to form a toroidally shaped region of higher gas density adjacent to sidewalls of the container, wherein the second winding is disposed around the container between the first winding and the container inlet and the first winding is disposed adjacent to the toroidally shaped region of higher gas density, wherein the toroidally shaped region of higher gas density and the first winding are positioned to define a toroidally shaped plasma zone inside the container having a maximum plasma density during operation of the remote plasma generator system.

2. The system of claim 1, wherein the energy source comprises a matching network and a radio frequency generator electrically coupled thereto.

3. The system of claim 1, wherein the capacitor is adapted to limit a peak-to-peak voltage flow through the coil to a threshold voltage that is about 50% of an initial voltage input into the first end of the continuous coil.

4. The system of claim 1, wherein the first winding has a diameter that is larger than a diameter of the second winding.

5. The system of claim 1, wherein the plurality of openings are symmetrically distributed around the longitudinal axis and equally spaced from the longitudinal axis.

6. The system of claim 1, wherein the acute angle for each identically oriented opening is between about 45° and about 90°.

7. The system of claim 1, wherein each opening of the plurality of openings has a diameter in a range of between about 0.5 mm to about 5.0 mm.

8. The system of claim 1, wherein the container has an axial length and a substantially uniform diameter along the axial length.

9. The system of claim 1, wherein:
the container has a plasma-containing section of varying diameter along an axial length thereof and a tube section extending therefrom, the tube section having a uniform diameter along an axial length thereof; and
the continuous coil surrounds the plasma-containing section.

10. The system of claim 9, wherein the continuous coil is adapted to provide an electric field across the container for forming the toroidally shaped plasma zone therein, in response to energy supplied thereto.

11. The system of claim 9, wherein the tube section of the container has an axial length that is less than an axial length of the plasma-containing section.

12. The system of claim 9, wherein the plasma-containing section has a dome shape.

13. The system of claim 9, wherein the plasma-containing section has a conical shape.

14. A remote plasma generator system comprising:
- a container defining a chamber and having an inlet end and an outlet end opposite the inlet end, wherein the container includes a plasma-containing section of varying diameter along an axial length thereof and a tube section extending therefrom, the tube section having a uniform diameter along an axial length thereof, wherein the tube section has an axial length that is less than an axial length of the plasma-containing section;
- a continuous coil disposed around the plasma-containing section of the container, the continuous coil having a first end, a second end, a first winding, and a second winding, wherein the first winding extends from the first end and the second winding is integral with the first winding and extends to the second end;
- an energy source electrically coupled directly to the first end of the continuous coil;
- an electrical ground connection coupled to the second end of the continuous coil;
- a capacitor electrically coupled directly to the second end of the continuous coil between the electrical ground connection and the second winding, wherein the continuous coil is free of any other capacitors between the first end and the capacitor; and
- a gas flow distribution receptacle disposed in the container inlet, the gas flow distribution receptacle including a cup member having a cylindrical section attached to the inlet end of the container with one end and having hemispherically-shaped section on another end, the hemispherically-shaped section comprising a plurality of openings symmetrically distributed around the hemispherical-shaped section, wherein each opening of the hemispherical-shaped section is oriented at an acute angle relative to a longitudinal axis defined by the cylindrical section of the receptacle, the openings being oriented at identical acute angles that direct gas flow towards the first winding of the continuous coil to form a toroidally shaped region of higher gas density adjacent to sidewalls of the container, wherein the second winding is disposed around the plasma-containing section of the container between the first winding and the inlet end and the first winding is disposed adjacent to the toroidally shaped region of higher gas density, wherein the toroidally shaped region of higher gas density and the first winding are positioned to define a toroidally shaped plasma zone inside the container having a maximum plasma density during operation of the remote plasma generator system.

15. The system of claim 14, wherein the energy source comprises a matching network and a radio frequency generator electrically coupled thereto.

16. The system of claim 14, wherein the capacitor is adapted to limit a peak-to-peak voltage flow through the continuous coil to a threshold voltage that is about 50% of an initial voltage input into the first end of the continuous coil.

17. The system of claim 14, wherein the acute angle for each identically oriented opening is between about 45° and about 90°.

18. The system of claim 14, wherein each opening of the plurality of openings has a diameter in a range of between about 0.5 mm to about 5.0 mm.

* * * * *